United States Patent [19]
Iizuka

[11] 4,172,221
[45] Oct. 23, 1979

[54] CIRCUIT ARRANGEMENT FOR AUTOMATICALLY CLOSING A SWITCHING TRANSISTOR FOR A PREDETERMINED TIME PERIOD AFTER OPENING A SWITCHING MEANS

[75] Inventor: Nobuyoshi Iizuka, Yokohama, Japan

[73] Assignee: Victor Company of Japan, Limited, Yokohama, Japan

[21] Appl. No.: 798,009

[22] Filed: May 18, 1977

[30] Foreign Application Priority Data

May 19, 1976 [JP] Japan ............................ 51/63630[U]

[51] Int. Cl.$^2$ ............................................. H01J 39/12
[52] U.S. Cl. ...................... 250/214 SW; 250/214 A; 307/311; 360/74.1
[58] Field of Search ................. 250/214 A, 214 SW; 307/311; 360/74; 315/156, 157

[56] References Cited
U.S. PATENT DOCUMENTS

| | | | |
|---|---|---|---|
| 2,416,595 | 2/1947 | Reynolds | 315/157 X |
| 3,210,611 | 10/1965 | Krenke | 250/214 SW X |
| 3,218,462 | 11/1965 | Raub et al. | 250/214 A X |
| 3,308,276 | 3/1967 | Panagiotou et al. | 250/214 SW X |
| 3,566,132 | 2/1971 | Walker | 307/311 X |

*Primary Examiner*—Lawrence J. Dahl
*Attorney, Agent, or Firm*—Lowe, King, Price and Becker

[57] ABSTRACT

A light-emitting diode of a photo-coupler is energized and de-energized through a connection to a switching means. Radiation from the light-emitting diode directed toward a photosensitive means of the photocoupler, reduces the resistance of the photosensitive means to rendering a switching transistor conductive. The switching transistor is connected to and controlled by the photosensitive means. When the switching means is open, the switching transistor remains conductive for a predetermined time period due to a transient phenomena of a resistance change of the photosensitive resistor.

13 Claims, 1 Drawing Figure

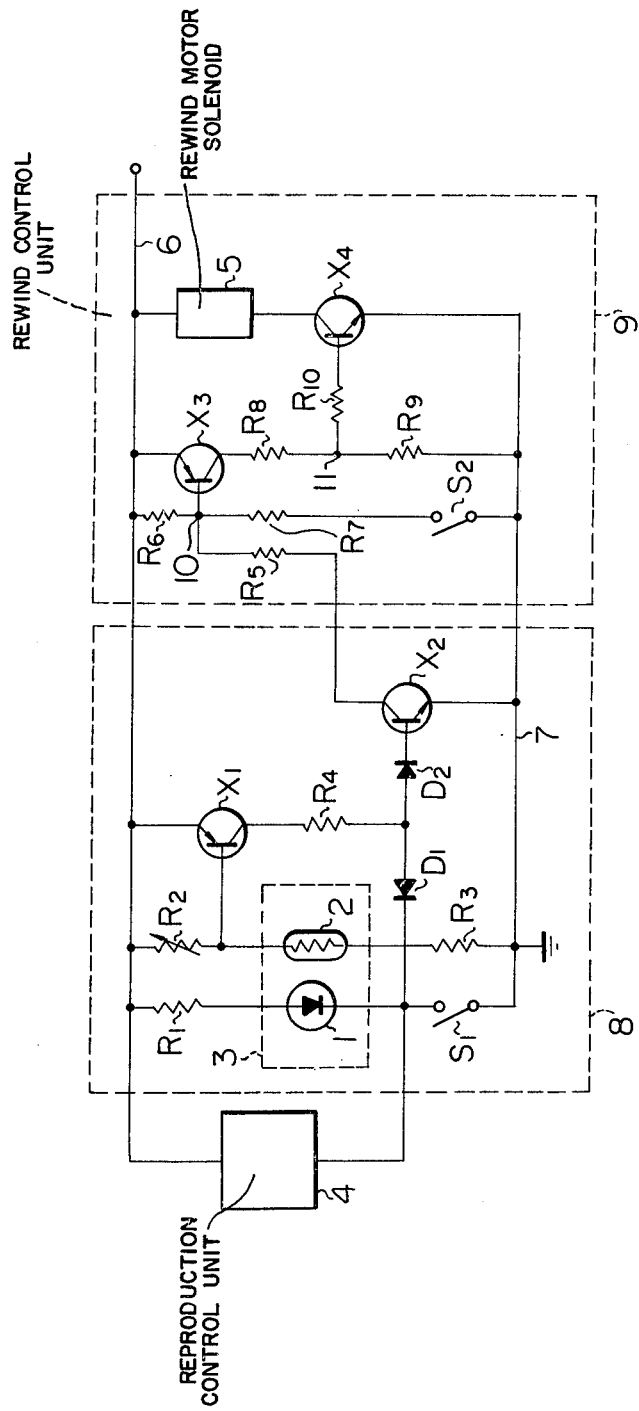

CIRCUIT ARRANGEMENT FOR AUTOMATICALLY CLOSING A SWITCHING TRANSISTOR FOR A PREDETERMINED TIME PERIOD AFTER OPENING A SWITCHING MEANS

FIELD OF INVENTION

The present invention relates to optically coupled switching circuits and more particularly to a circuit for automatically closing a switching transistor for a predetermined time period after opening a switching means.

BACKGROUND OF THE INVENTION

Circuits for automatically closing a switching transistor for a predetermined interval after a switch has been opened are very useful for rewinding a magnetic tape of a magnetic tape recorder/player for a predetermined short time period after a reproduction mode thereof has closed. According to the prior art, a capacitor is used for such a purpose by employing its charging and discharging time constant. However, the prior art is complicated and has poor reliability in that (1) an additional charging and discharging circuit is required and (2) the time change can not be negligible with respect to the electrical characteristic of the capacitor.

SUMMARY OF THE INVENTION

The present invention relates to a circuit for automatically closing a switching transistor for a predetermined time period after opening a switching means. The circuit includes a radiation emissive element connected in series with said switch between first and second terminals of a DC voltage source. The emissive element emits radiation in response to a first circuit condition of the switch. Optically coupled to the emissive element is a radiation responsive element having a resistance which varies instantaneously from a normal value in response to receipt of the emitted radiation. The radiation responsive element gradually returns to the normal value as a function of time when the emissive element is in a second condition of the switch. The radiation responsive element is connected in series with a resistance element between the first and second voltage source terminals. A transistor has a control electrode connected to be responsive to the voltage at a junction between the radiation responsive element and the resistance element. The transistor assumes a first switching state when the voltage is below a predetermined threshold level and a second switching state when the voltage is above said threshold level. Thereby, there is a voltage transition in the circuit from a first to a second voltage level in response to the switch being switched to a second circuit condition. There is a transition of the voltage from the second to the first voltage level in response to the transistor assuming the second switching state.

In one preferred application, the circuit is used with a reproduction control unit and a tape motor rewind control unit of a tape recorder/playback device. In such an application, the switch which controls energization of the radiation emitting means also controls the reproduction control unit so both are simultaneously energized and de-energized. The voltage transition controls the rewind control unit so the motor is activated simultaneously with the reproduction control unit being energized by the switch means closure and the motor remains activated for a short time after the reproduction control unit is de-energized by opening of the switch means.

BRIEF DESCRIPTION OF THE DRAWINGS

The single FIGURE is a schematic circuit diagram of a preferred embodiment of the present invention.

DESCRIPTION OF THE PREFERRED EMBODIMENT

A circuit arrangement 8 embodying the present invention is described in connection with, by way of example, a reproduction control unit 4 and a rewind control unit 9 of a magnetic tape recorder/player however, circuit 8 is not limited to use with peripheral units 4 and 9. Opto-electric coupler 3, connected between a pair of power supply lines 6 and 7, includes a photodiode 1 and a photosensitive resistor 2. The anode and cathode of photo diode 1 are respectively connected to the line 6 through a resistor R1, and to the line 7 through suitable, normally open contact switching means S1. Opposite ends of photosensitive resistor 2 are respectively connected to line 6 through variable resistor R2 and to line 7 through resistor R3. The reproduction control unit 4 is connected between line 6 and switching means S1, whereby the magnetic tape recorder/player is activated into a reproduction mode only while switching means S1 is closed. The base of switching transistor X1 is connected to a junction (no numeral) between resistor R2 and photosensitive resistor 2; the emitter and collector of transistor X1 are respectively connected to line 6 and to one end of resistor R4. The other end of the resistor R4 is connected to a common terminal for the anodes of diodes D1 and D2. The cathodes of diodes D1 and D2 are respectively connected to switching means S1 and to the base of switching transistor X2. The emitter and the collector of the transistor X2 are respectively connected to the line 7 and to the base of the transistor X3 through a resistor R5. Resistors R6 and R7 and a switching means S2 are connected in series between the lines 6 and 7. A voltage at terminal 10 between resistors R6 and R7 is applied to the base of a transistor X3 for rendering the transistor X3 conductive at least when the switching means S2 closes. The collector of the transistor X3 is connected to the line 7 through series connected resistors R8 and R9, having a common terminal 11 connected through resistor R10 to the base of transistor X4. The collector of the transistor X4 is connected to line 6 through a rewind control means 5, such as a solenoid of a rewind motor (not shown); the emitter of transistor X4 is connected directly to line 7.

In operation, when switching means S1 closes, reproduction control unit 4 activates the magnetic tape recorder/player into reproduction mode as previously mentioned; simultaneously light-emitting diode 1 begins emitting a light beam toward photosensitive resistor 2. When resistor 2 is irradiated by the light beam, its resistance is reduced instantaneously from a normal value to render transistor X1 conductive. Current flowing through transistor X1 flows through the diode D1 and the closed switching means S1. Therefore, the voltage at the base of the transistor X2 is nearly equal to ground potential, so that the transistor X2 remains non-conductive. The diode D2 compensates for a voltage drop across the diode D1, whereby the proper operation of the transistor X2 is ensured.

When switching means S1 opens, the reproduction control unit 4 is de-energized, stopping the reproduction mode; at the same time, light-emitting diode 1 stops emitting the light beam. Therefore, the resistance of the photosensitive resistor 2 increases so that the voltage applied to the base of the transistor X1 rises. The transient time of the resistance change of resistor 2, is about 0.5 second if a "CdS" cell is used as resistor 2; i.e., about 0.5 seconds is required for resistor 2 to be restored to a resistance 95% of its normal value. As a result, the transistor X1 remains conductive for a predetermined time period after switching means S1 opens, until the resistance of resistor 2 increases to approximately its normal value. Since switching means S1 is open, current flowing through the emitter collector path of transistor X1 flows into the base of the transistor X2, rendering the same conductive.

Hereafter, it is assumed that the switching means S2 is in its open condition. If the transistor X2 is conductive, a current flows through the resistors R6 and R5, developing a suitable voltage for rendering transistor X3 conductive. Rendering of transistor X3 into a conductive state in turn causes transistor X4 to be conductive, so that rewind control means 5, such as the solenoid of the rewind motor (not shown), is energized to rewind the magnetic tape (not shown) only while the transistor X2 is conductive.

Summing up, rewinding of the magnetic tape (not shown) is carried out until the voltage at the junction between the resistors R2 and 2 increases to a threshold level for conduction of transistor X1 after the light-emitting diode 1 is de-energized. The rewinding time period (usually up to 0.2–0.3 seconds), which corresponds to 4–5 seconds under reproduction mode, is controlled by changing the resistance value of the variable resistor R2.

Switching means S2, while depressed is used for rewinding the magnetic tape and is not directly concerned with the present invention.

In the above, the light emitting diode 1 can be replaced by an incandescent lamp or a neon lamp and the photosensitive resistor 2 is a suitable element such as "CdS" or "CdSe" cell. If light emitting diode 1 is replaced by a light source, such as an incandescent lamp, having light emission which occurs after the source is deenergized, the photosensitive resistor 2 can be replaced by a high-speed photosensitive device, such as a photo-transistor.

Although the present invention has been described in its preferred form with a certain degree of particularity, it is understood that the present disclosure of the present form has been made only by way of example and that numerous changes in the details of combination and arrangement of parts may be resorted to without departing from the scope of the invention as hereinafter claimed.

What is claimed is:

1. A circuit arrangement for energizing a load device for a predetermined time period after operation of a switch, comprising:
    a radiation emissive element, connected in series with said switch between first and second terminals of a voltage source, for emitting radiation in response to a first circuit condition of said switch;
    a radiation responsive element having a resistance which varies instantaneously from a normal value in response to receipt of the emitted radiation and gradually returns to the normal value as a function of time in response to the absence of said radiation, said radiation responsive element being connected in series with a resistance element between said first and second voltage source terminals; and
    a transistor having a control electrode connected to be responsive to the voltage at a junction between said radiation responsive element and said resistance element, said control electrode being responsive to the voltage at the junction to cause the transistor to assume first and second switching states in response to said voltage being respectively below and above a predetermined threshold level, whereby there is a transition of a voltage in said circuit arrangement from first to second voltage levels in response to said switch being switched to a second circuit condition and there is a transition of said voltage from said second to first voltage levels in response to said transistor assuming said second switching state.

2. The circuit of claim 1 further comprising a load resistance element connected between said first and second voltage source terminals through said transistor.

3. The circuit of claim 2 wherein said switch is connected in series with an emitter collector path of said transistor.

4. The circuit of claim 3 further comprising a diode connected between said switch and said load resistance element, and a second transistor having a control electrode connected to a junction between said diode and said load resistance element, the load device and said second transistor being connected in series between said first and second voltage source terminals, said diode being poled to provide a conduction path to the control electrode of said second transistor through said switch when the switch is in the first circuit condition.

5. The circuit of claim 4 further comprising a second diode connected between said load resistance element and the control electrode of said second transistor to bias same through the first-mentioned transistor.

6. The circuit of claim 1 wherein said resistance is a variable resistor.

7. The circuit of claim 1 wherein said radiation emissive element is a light-emitting diode and said radiation responsive element is a photodiode having a resistance which is reduced in response to receipt of light from said light-emitting diode and increased as a function of time in response to the absence of said light.

8. In combination, a tape recorder having means for effecting playback of recorded material and means for effecting rewinding of tape, a circuit comprising: a switch, a radiation emissive element connected in series with said switch between first and second terminals of a voltage source, said emissive element emitting radiation in response to a first circuit condition of said switch, a radiation responsive element characterized by a resistance which varies instantaneously from a normal value in response to receipt of said emitted radiation and gradually returns to the normal value as a function of time in response to the absence of said radiation, said radiation responsive element being connected in series with a resistance element between the first and second voltage source terminals, a first transistor having a control electrode connected to be responsive to the voltage at a junction between said radiation responsive element and said resistance element, said control electrode being responsive to the voltage at the junction to cause the transistor to assume first and second switching states in response to said voltage being respectively below and above a predetermined threshold level, whereby there is a transition of a voltage in said circuit from a first to a second level in response to said switch being switched to a second circuit condition and there is a transition of said voltage from said second to first voltage levels in response to said first transistor assuming said second switching state, and a second transistor responsive to the circuit voltage transition and connected to assume a first switching state in response to said voltage transition from the first to the second voltage level and assume a second switching state in response to said voltage transition from the second to first voltage level; said switch being further connected to operate said playback effecting means of said tape recorder, said second transistor being connected to operate said tape rewinding effecting means so that the rewinding means remains activated after the switching means is activated to the second circuit condition.

9. A combination as claimed in claim 8, further comprising a load resistance element connected between the control electrode of said second transistor and one of the controlled electrodes of said first transistor.

10. A combination as claimed in claim 8, wherein said resistance element is a variable resistor.

11. A combination as claimed in claim 9, further comprising a diode connected between said switch and said load resistance element, a junction between said diode and said load resistance element being connected to the control electrode of said second transistor to provide a conduction path to said second transistor control electrode in response to said switching assuming said first circuit condition.

12. A combination as claimed in claim 11, further comprising a second diode connected between a junction of the first-mentioned diode and said load resistance element and said second transistor control electrode.

13. A circuit arrangement for energizing a load device for a predetermined time period after operation of a switch, comprising:
a radiation emissive element connected in circuit with said switch between first and second terminals of a voltage source, said element emitting radiation in response to current being supplied to the element by the source in response to the switch being activated to a first circuit condition from a second circuit condition during which current is not supplied to the element;
a radiation responsive element having a resistance which varies instantaneously from a normal value in response to emitted radiation resulting from energization of the switch to the first condition, the resistance of the radiation responsive element gradually returning to the normal value as a function of time in response to the switch being activated to the second condition, said radiation responsive element being connected in series with a resistance element between said first and second voltage source terminals; and
a transistor having a control electrode connected to be responsive to the voltage at a junction between said radiation responsive element and said resistance element, said control electrode being responsive to the voltage at the junction to cause the transistor to assume first and second switching states in response to said voltage being respectively below and above a predetermined threshold level;
whereby there is a transition of a voltage in said circuit arrangement from first to second voltage levels in response to said switch being switched to a second circuit condition and there is a transition of said voltage from said second to first voltage levels in response to said transistor assuming said second switching state.

* * * * *